US012700871B2

(12) United States Patent
Tsinker

(10) Patent No.: US 12,700,871 B2
(45) Date of Patent: Aug. 4, 2026

(54) CONTINUOUS TIME PIPELINE ANALOG-TO-DIGITAL CONVERSION

(71) Applicant: InvenSense, Inc., San Jose, CA (US)

(72) Inventor: Vadim Tsinker, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 88 days.

(21) Appl. No.: 18/240,514

(22) Filed: Aug. 31, 2023

(65) Prior Publication Data

US 2025/0080130 A1     Mar. 6, 2025

(51) Int. Cl.
*H03M 1/38*          (2006.01)
(52) U.S. Cl.
CPC ..................................... *H03M 1/38* (2013.01)
(58) Field of Classification Search
CPC ...... H03M 1/60; H03M 1/1245; H03M 1/145;
H03M 1/403; H03M 1/46; H03M 1/52;
H03M 1/804; H03M 1/0695; H03M
1/1225; H03M 1/14; H03M 1/466; H03M
1/468; H03M 1/12; H03M 1/129; H03M
1/38; H03M 1/40; H03M 1/44; H03M
3/43; H03M 1/00; H03M 1/002; H03M
1/02; H03M 1/0609; H03M 1/0673;
H03M 1/08; H03M 1/1215; H03M 1/123;
H03M 1/141; H03M 1/50; H03M 1/54;
H03M 1/56; H03M 3/34; H03M 3/342;
H03M 3/456; H03M 3/46; H03M 3/466;
H03M 3/474; H03M 3/496; H03M 1/06;
H03M 1/0602; H03M 1/0604; H03M
1/0607; H03M 1/0626; H03M 1/066;
H03M 1/0845; H03M 1/10; H03M 1/1023; H03M 1/1057; H03M 1/1205;
H03M 1/122; H03M 1/124; H03M
1/1295; H03M 1/144; H03M 1/16; H03M
1/162; H03M 1/164; H03M 1/167; H03M
1/18; H03M 1/183; H03M 1/201; H03M
1/34; H03M 1/365; H03M 1/442; H03M
1/462; H03M 1/66; H03M 1/667; H03M
1/806; H03M 13/09; H03M 3/02; H03M
3/30; H03M 3/358; H03M 3/38; H03M
3/39; H03M 3/396; H03M 3/398; H03M
3/404; H03M 3/412; H03M 3/414;
(Continued)

(56) References Cited

U.S. PATENT DOCUMENTS 5,101,206 A  *   3/1992  Riedel ..................... H03M 1/14
                                                        341/120
5,367,302 A  *  11/1994  Kalthoff ............... H03M 1/804
                                                        341/166
(Continued)

FOREIGN PATENT DOCUMENTS

CN          114928360 A       8/2022

*Primary Examiner* — Linh V Nguyen
(74) *Attorney, Agent, or Firm* — Van Hoven PC; Joshua Van Hoven

(57)          ABSTRACT

A continuous time reconfigurable integrator is dynamically reconfigurable to facilitate real time high-resolution modification of the integrator output signal. An initial output of the integrator is evaluated to generate a coarse estimate which is then used to modify capacitive inputs to the integrator, which result in the output of a residue signal. The initial and residue outputs are individually processed by an analog-to-digital converter (ADC), such as a successive-approximation-register ADC, and digitally combined.

18 Claims, 10 Drawing Sheets

(58) Field of Classification Search
CPC ...... H03M 3/422; H03M 3/436; H03M 3/444;
H03M 3/454; H03M 3/458; H03M 3/464;
H03M 3/486; H03M 3/49
USPC .......................................... 341/155, 161, 162
See application file for complete search history.

(56) References Cited

U.S. PATENT DOCUMENTS

| | | | | |
|---|---|---|---|---|
| 6,037,887 | A * | 3/2000 | Wu ........................ | H03M 3/486 |
| | | | | 341/139 |
| 6,366,231 | B1 * | 4/2002 | Rao ........................ | H03M 1/141 |
| | | | | 341/166 |
| 7,164,379 | B1 * | 1/2007 | Rao ........................ | H03M 1/52 |
| | | | | 341/161 |
| 7,265,705 | B1 * | 9/2007 | Lee ........................ | H03M 1/145 |
| | | | | 341/162 |
| 7,535,391 | B1 * | 5/2009 | Newman ............. | H03M 1/0673 |
| | | | | 341/131 |
| 8,988,267 | B1 * | 3/2015 | Kimura ................ | H04N 25/771 |
| | | | | 341/172 |
| 9,128,195 | B2 * | 9/2015 | Soh ........................ | H04N 5/32 |
| 9,219,492 | B1 * | 12/2015 | Lok ........................ | H03M 1/002 |
| 9,606,511 | B2 * | 3/2017 | Kurose .................. | H03M 1/50 |
| 10,365,104 | B2 | 7/2019 | Collin et al. | |
| 10,615,818 | B1 * | 4/2020 | Singh .................... | H03M 3/496 |
| 2005/0140537 | A1 * | 6/2005 | Waltari ............... | H03M 1/1245 |
| | | | | 341/172 |
| 2010/0215146 | A1 * | 8/2010 | Rao ........................ | H03M 1/183 |
| | | | | 378/62 |
| 2011/0234441 | A1 * | 9/2011 | Makihara ............ | H03M 1/1225 |
| | | | | 341/172 |
| 2021/0359700 | A1 * | 11/2021 | Chen ..................... | H03M 3/464 |
| 2022/0057207 | A1 | 2/2022 | Pinna et al. | |
| 2023/0170917 | A1 * | 6/2023 | Ogiwara ................ | H03M 1/14 |
| | | | | 341/144 |
| 2023/0273025 | A1 | 8/2023 | Tsinker et al. | |
| 2024/0356560 | A1 * | 10/2024 | Tan ........................ | H03M 1/468 |

* cited by examiner

902

Reset Integrator

904

Initial Measurement

906

Perform Coarse Estimate

908

Modify Signals Applied to Reference Capacitors

910

Digitize Residue Output

912

Digitally Combine Initial and Residue Values Into Combined Result

CONTINUOUS TIME PIPELINE ANALOG-TO-DIGITAL CONVERSION

BACKGROUND

Numerous items such as smart phones, smart watches, tablets, automobiles, aerial drones, appliances, aircraft, exercise aids, and game controllers may utilize sensors such as microelectromechanical system (MEMS) sensors during their operation. In many applications, various types of motion sensors such as accelerometers and gyroscopes may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions).

As MEMS sensors are utilized to capture complex movements in a wide variety of applications, there are limitations on the space that can be utilized for design of sensor components and circuitry, as well as the power demand of those components. Designs intended to optimize sensor size and power consumption, such as shared signal paths for processing of sensor outputs, may be difficult to implement effectively, for example, due to inherent delays and settling times of signal processing circuitry, or available dynamic range of circuit components.

SUMMARY

In an embodiment of the present disclosure, a method for processing a sensed signal for analog-to-digital conversion (ADC) comprises resetting an integrator circuit such that a previous output value from the integrator circuit is no longer present at an output of the integrator circuit. The method may further comprise receiving, at an input to the integrator circuit, the sensed signal, integrating, by the integrator circuit, the sensed signal, and evaluating an output of the integrator circuit due to the integrating to generate an estimate of the integrated signal. The method may further comprise modifying the output of the integrator circuit based on the estimate and determining a digital value for the sensed signal based on the modified output.

In an embodiment of the present disclosure, a method for processing a sensed signal from one of a plurality of inertial sensor comprises switching an input node of an integrator circuit into electrical connection with the one of the plurality of inertial sensors, receiving, at the input node of the integrator circuit, the sensed signal, and integrating, by the integrator circuit, the sensed signal. The method may further comprise evaluating an output of the integrator circuit due to the integrating to generate an estimate of the integrated signal, generating, based on the evaluating, a residual estimate associated with the sensed signal, modifying a source signal provided to one or more capacitors connected to the integrator circuit based on the residual estimate, and outputting a modified signal based on the modifying.

In an embodiment of the present disclosure, a system for processing a sensed signal for analog-to-digital conversion, comprising an integrator circuit and a comparison circuit coupled to an output of the integrator circuit, wherein the comparison circuit generates one or more control signals based on the output of the integrator circuit. The system may further comprise a plurality of capacitors coupled to an input of the integrator circuit and a plurality of signal sources each associated with one or more of the plurality of capacitors, wherein a respective connection between respective signal sources of the plurality of signal sources and respective capacitors of the plurality of capacitors is modified based on the one or more control signals.

BRIEF DESCRIPTION OF DRAWINGS

The above and other features of the present disclosure, its nature, and various advantages will be more apparent upon consideration of the following detailed description, taken in conjunction with the accompanying drawings in which.

DETAILED DESCRIPTION

Figure 1:
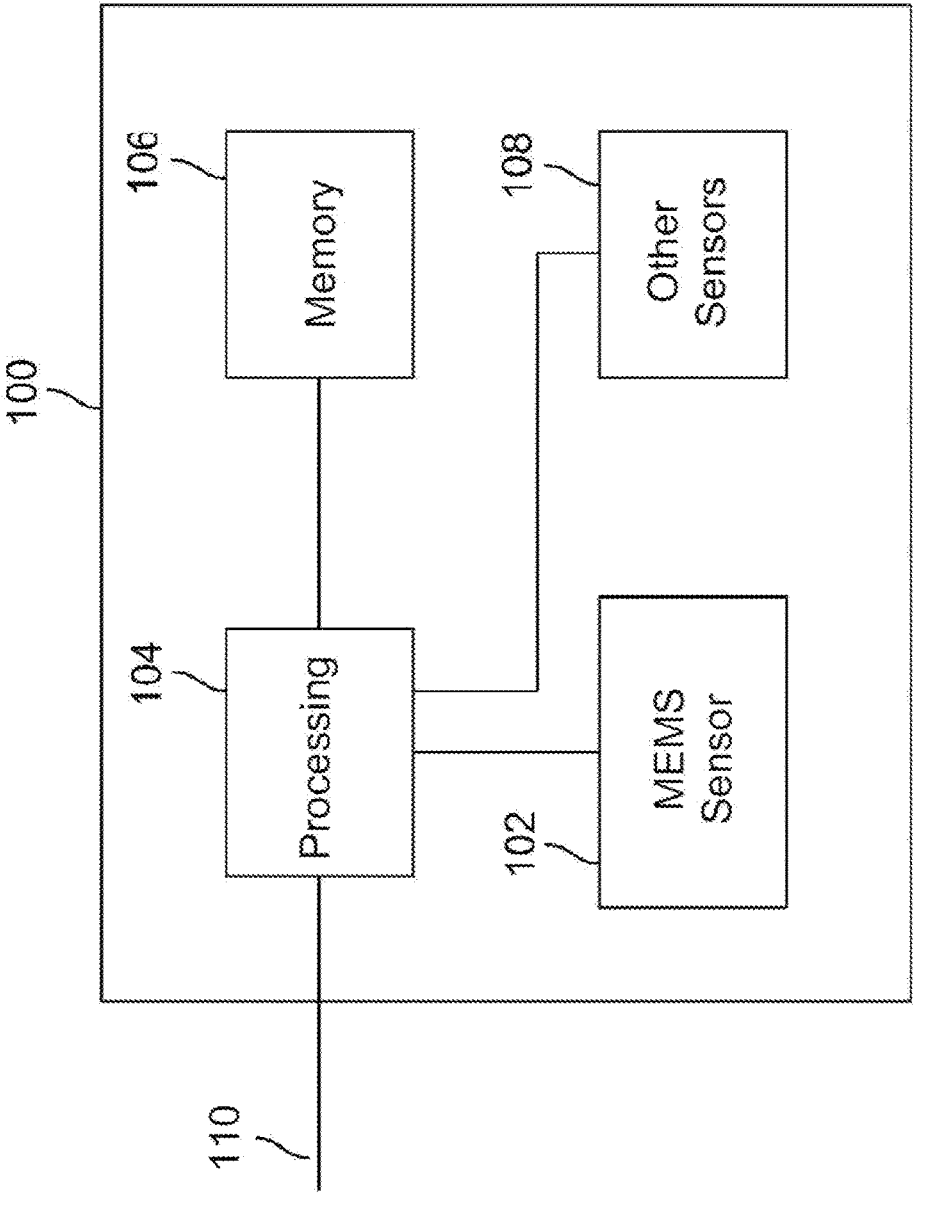
FIG. 1 shows an illustrative MEMS system in accordance with an embodiment of the present disclosure.

Continuous time analog-to-digital converters (ADCs) have an inherent advantage over discrete time ADCs, since they do not alias noise. An example of such a continuous time ADC is a continuous-time Sigma-Delta ADC, which provides high linearity in addition to noise anti-aliasing properties. However, a disadvantage of a Sigma-Delta ADC is its relatively large quantization noise and a requirement for additional post filtering or decimation in order to reduce this quantization noise. This filtering increases latency and prevents round-robin (e.g., multiplexed) implementation of an analog sensor path, for example, where a single set of processing circuitry components (e.g., capacitance to voltage converters, filters, ADC, etc.) is used by multiple sensor outputs (e.g., from different axes of a MEMS gyroscope, or different types of MEMS sensors). Further, a Sigma-Delta ADC has high frequency digital and analog components (e.g., amplifiers) that contribute to substantial current and power consumption, even on a single axis. This power consumption is exacerbated in view of the high-latency, which makes round-robin sensing difficult and thus requires multiple duplicated sets of components performing the same function for different sense axes and sensor types.

A high-resolution continuous time Nyquist ADC avoids such problems by inherently having a small quantization noise. A single sense path (e.g., an integrator and ADC) may be utilized for multiple sensor axes and types (e.g., in a round-robin fashion), while using only one low speed component (e.g., an integrator) and one high speed component (e.g., a SAR ADC without amplifiers). The component types and the ability to have single shared signal path results in substantial circuit area and current savings. In addition, due to the fact that SAR ADC receives amplified residue, the input referred noise of the SAR is significantly suppressed, leaving only the integrator as a dominant noise contributor.

A continuous time resettable and reconfigurable integrator and a successive-approximation-register (SAR) ADC are combined to create a high resolution, continuous time Nyquist ADC. An integrator circuit is functional to provide high-precision continuous time sensing such as for output to an analog-to-digital converter (ADC) such as a SAR ADC. Different input signals may be provided in succession and with a relatively high switching frequency to the high-precision integrator without compromising the precision of the output signal provided to the SAR ADC. In an initial state, the high-precision integrator is reset, such as by shorting between an input node and output node of an amplifier (e.g., a capacitance-to-voltage or C2V amplifier) of the high-precision integrator.

A signal to be evaluated is provided to the integrator for a substantial portion of a conversion period, with the duration of such portion set by integrator R (resistor) and C (capacitor) components needed to establish required signal gain at the end of the integration time. The signal source may be switched out of the integrator circuit path for evaluation of the signal. An initial output is provided by the integrator to evaluation circuitry such as a comparator array (e.g., a bitwise comparator), which performs a coarse estimate of the output signal. An estimate is generated based on the initial received signal and control signals are provided based on the estimate to generate an amplified residue signal, such as by modifying voltages provided to selected capacitors located at an input node of the amplifier of the integrator. The resulting modified output signal thus includes an amplification of the residual (e.g., fine resolution) portion of the original received signal. The modified output signal is then processed by the SAR ADC. The respective outputs from the SAR ADC are then combined digitally with initial output to determine the value of the final digital output signal.

In embodiments, the relative precision of the high-precision integrator may be increased such as by increasing the number of comparators in the comparator array of the evaluation circuit and similarly modifying the number of capacitors that have their input values controlled by control signal outputs of the evaluation circuit. In the context of a MEMS system such as a multi-axis inertial sensor, sensor outputs (e.g., from different axes and/or sensor types) may be switched into the input of the high-precision integrator, evaluation circuit, and SAR ADC to provide a single shared processing path for multiple sensors.

FIG. 1 shows an illustrative MEMS system 100 in accordance with an embodiment of the present disclosure. Although particular components are depicted in FIG. 1, it will be understood that other suitable combinations of the MEMS, processing components, memory, and other circuitry may be utilized as necessary for different applications and systems. In accordance with the present disclosure, the MEMS system may include a MEMS sensor 102 as well as additional sensors 108. Although the present disclosure will be described in the context of signals received from MEMS sensors, it will be understood that the continuous time pipeline ADC of the present disclosure may be utilized with any suitable signal requiring high-precision and high-speed conversion of received analog signals into an accurate digital output. Depending on the particular application, certain components such as respective resistor and capacitor values, reference voltages, comparator array precision, and the like may be modified, for example, to optimize for particular frequency ranges of interest.

Processing circuitry 104 may include one or more components providing processing based on the requirements of the MEMS system 100. In some embodiments, processing circuitry 104 may include hardware control logic that may be integrated within a chip of a sensor (e.g., on a base substrate of a MEMS sensor 102 or other sensors 108, or on an adjacent portion of a chip to the MEMS sensor 102 or other sensors 108) to control the operation of the MEMS sensor 102 or other sensors 108 and perform aspects of processing for the MEMS sensor 102 or the other sensors 108. In some embodiments, the MEMS sensor 102 and other sensors 108 may include one or more registers that allow aspects of the operation of hardware control logic to be modified (e.g., by modifying a value of a register). In some embodiments, processing circuitry 104 may also include a processor such as a microprocessor that executes software instructions, e.g., that are stored in memory 106. The microprocessor may control the operation of the MEMS sensor 102 by interacting with the hardware control logic and processing signals received from MEMS sensor 102. The microprocessor may interact with other sensors 108 in a similar manner. In some embodiments, some or all of the functions of the processing circuitry 104, and in some embodiments, of memory 106, may be implemented on an application specific integrated circuit ("ASIC") and/or a field programmable gate array ("FPGA").

Although in some embodiments (not depicted in FIG. 1), the MEMS sensor 102 or other sensors 108 may communicate directly with external circuitry (e.g., via a serial bus or direct connection to sensor outputs and control inputs), in an embodiment the processing circuitry 104 may process data received from the MEMS sensor 102 and other sensors 108 and communicate with external components via a communication interface 110 (e.g., a serial peripheral interface (SPI) or I2C bus, in automotive applications a controller area network (CAN) or Local Interconnect Network (LIN) bus, or in other applications a suitably wired or wireless communications interface as is known in the art). The processing circuitry 104 may convert signals received from the MEMS sensor 102 and other sensors 108 into appropriate measurement units (e.g., based on settings provided by other computing units communicating over the communication interface 110) and perform more complex processing to determine measurements such as orientation or Euler angles, and in some embodiments, to determine from sensor data whether a particular activity (e.g., walking, running, braking, skidding, rolling, etc.) is taking place. In some embodiments, some or all of the conversions or calculations may take place on the hardware control logic or other on-chip processing of the MEMS sensor 102 or other sensors 108.

In some embodiments, certain types of information may be determined based on data from multiple MEMS sensors 102 and other sensors 108 in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

In embodiments of the present disclosure, a high-precision integrator may receive a sensed analog signal such as a signal including one of a set of time-multiplexed outputs from multiple MEMS inertial sensors (e.g., including, at different times, signal portions for each output axis of a respective sensor type, and in some embodiments, for multiple sensor types). The high-precision integrator initially resets to remove any remaining signals such as from a portion of the signal associated with another output. After the reset is complete, the integrator receives the sensed signal for a suitable time period for integrator output to achieve required gain, after which the integrator enters an evaluation stage. In some implementations, the input signal to the high-precision integrator may be another type of analog signal, including from other types of sensors and devices. These analog signals may be processed by the same circuitry as a signal from a MEMS sensor (e.g., by being time-multiplexed with the MEMS signal) or may be processed separately (or without) any associated MEMS signals.

During the evaluation stage, the input signal is disconnected from the integrator input and the initial output is provided to an evaluation stage such as a comparator array, which generates a coarse estimate of the output to provide control signals (e.g., as multi-bit digital values) according to the evaluation. The control signals selectively provide desired signals of interest to the integrator input (e.g., via connection of selected capacitors within a capacitor back to respective source signals), resulting in a residual output that is provided to the ADC (e.g., a SAR ADC) for fine analog-to-digital conversion. The digitized initial and residue outputs are then combined digitally to generate the combined output signal. This process is then repeated for the signal being analyzed until the next input signal (e.g., from another sensor) is provided to the high-precision integrator.

Figure 2:
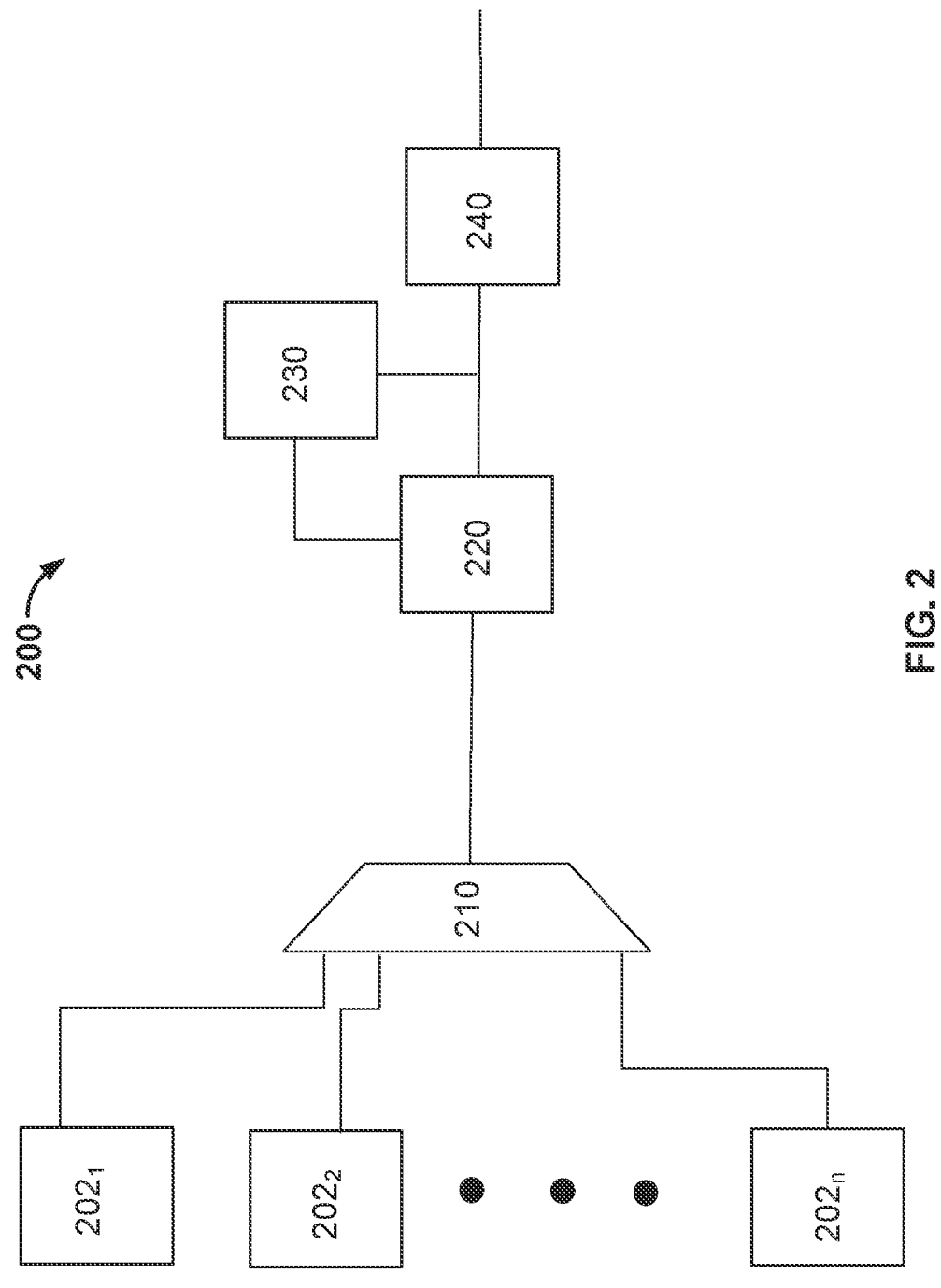
FIG. 2 depicts an exemplary multiplexed sensor system in accordance with an embodiment of the present disclosure.

FIG. 2 depicts an exemplary multiplexed sensor system in accordance with an embodiment of the present disclosure. Although FIG. 2 will be described in the context of a particular application and system components, it will be understood that the present disclosure may be utilized with a variety of applications where high-precision and high-speed analog-to-digital conversion is required, such as audio signal processing or touchscreen location processing. Although particular components are depicted and described in FIG. 2, it will be understood that components may be added, removed, substituted, or modified in accordance with the present disclosure. For example, in some embodiments initial signal processing, filtering, amplification, scaling, or the like may be provided at one or multiple positions within a sensor path.

In an embodiment of the present disclosure, multiple "n" sensors such as sensors $202_1$-$202_n$ of a device may simultaneously sense different information about a device, such as linear acceleration (e.g., along each of 3 perpendicular axes), angular velocity (e.g., about each of 3 perpendicular axes), pressure, magnetic field, etc. An example of such a system is described in U.S. patent application Ser. No. 17/680,637, filed on Feb. 25, 2022, and entitled "Round Robin Sensor Device for Processing Sensor Data," which is incorporated by reference herein in its entirety. Although signals are depicted as being output on a single signal line on the present disclosure, it will be understood that analog such signals may be provided in a variety of manners, such as via differential analog outputs.

A multiplexer stage 210 receives the output signals from sensors $202_1$-$202_n$ and selectively outputs a combined signal (e.g., a time-multiplexed signal selectively providing a portion of the signal from each of sensors $202_1$-$202_n$ during designated time periods). The timing and frequency of the change in the output from multiplexer stage 210 may be selected such that an output from each of sensors $202_1$-$202_n$ is sampled for a suitable time during each sampling period and with a suitable frequency to capture adequate information relative to expected changes in the output of the sensor due to the parameter being measured by the sensor. In the embodiment of the present disclosure, the output from the multiplexer stage is processed by a C2V amplifier and then provided to high-precision integrator 220.

As described herein, high-precision integrator 220 is configured to provide high-speed response and settling times to changes in input signals (e.g., measured values corresponding to changes in capacitance or charge of components of a sensor) sources or values, and in conjunction with evaluation circuitry 230, to provide a high-precision output signal (e.g., that is amplified and modified to include additional amplification of residue signal) to additional circuitry such as a SAR ADC 240. SAR ADC 240 outputs a digital value that is suitable for processing at the sensor package, device, or by external systems or components.

Figure 3:
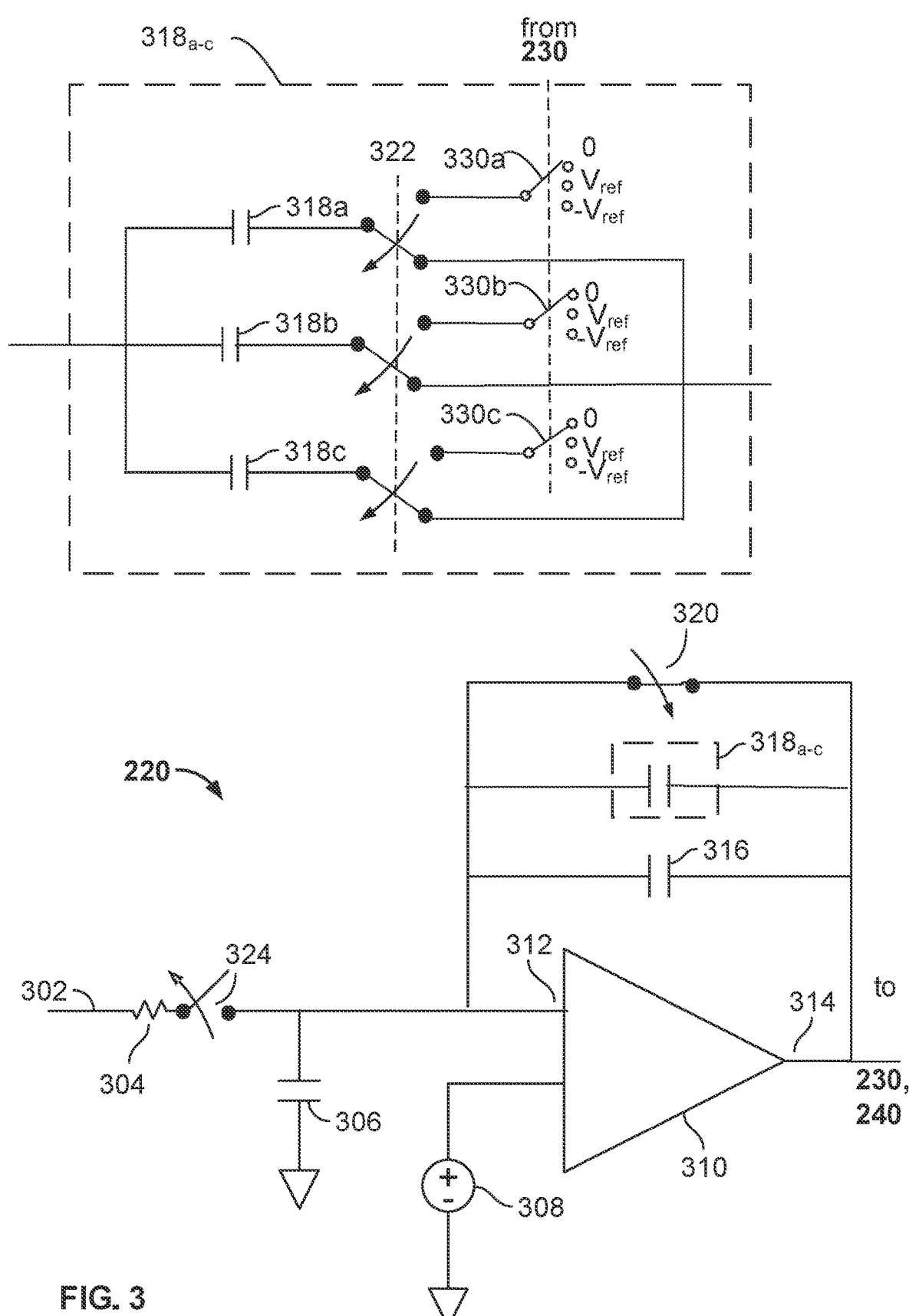
FIG. 3 depicts an exemplary high precision integrator in a reset mode in accordance with an embodiment of the present disclosure.

FIG. 3 depicts an exemplary high precision integrator 220 in a reset mode in accordance with an embodiment of the present disclosure. In the embodiment depicted in FIGS. 3-5 and 7-8, the high precision integrator 220 has components selected for an exemplary application (e.g., receiving a sense signal(s) corresponding to a capacitance output of a MEMS sensor) and desired output precision. It will be understood that in embodiments components may be added, removed, and modified for particular applications or desired output characteristics without departing from the present disclosure. For example, the overall resolution of the system can be modified, if desired, by increasing or decreasing the number of comparators (in FIG. 6A) and integrator capacitor partitions. In the embodiment of FIGS. 3-5, and 7-8, an input sense signal (e.g., from a MEMS sensor) is received as sense signal 302 and processed by components of high precision integrator 220 to provide an output signal from output node 314, which in turn is provide to evaluation circuitry 230 and SAR ADC 240.

Control signals are received from evaluation circuitry 230 and additional components such as switches (e.g., switches 320, 322, and 324) are controlled by processing circuitry and corresponding control signals (not depicted in FIGS. 3-5 and 7-8). Exemplary components of high-precision integrator include an input resistor 304, a parasitic capacitor 306, a voltage source 308, an amplifier 310, an amplifier input node 312, an amplifier output node 314, a feedback capacitor 316, a reference capacitor bank 318a-c, a reset switch 320, reference capacitor switch 322, and an input switch 324. Reference capacitor bank 318a-c may include reference capacitors 318a, 318b, and 318c, and in addition to reference capacitor switch 322, residue tuning switches 330a-c.

At an initial stage of operation of the high-precision integrator the integrator is reset to remove remaining signal (e.g., via charging of capacitors, etc.) from the high precision integrator, such as by closing the reference capacitor switch 322 (to bring the capacitors of reference capacitor bank 318a-c and feedback capacitor 316 into a parallel circuit with the reset switch 320) and reset switch 320. Reset switch 320 essentially resets and removes signal remnants from the integrator by creating a short between the amplifier input note 312 and amplifier output node 314, in parallel with feedback capacitor 316 and reference capacitor bank 318a-c. Although input switch 324 is depicted as opening in FIG. 3, a reset may also be performed if input switch 324 is closed. In this manner, both the signal output from amplifier output node 314 to the evaluation circuitry 230 and the SAR ADC 240, and the signal at the amplifier input node 312 that will receive the input signal, do not include any remaining signal to interfere with or modify the high-precision integrator input or output.

Figure 4:
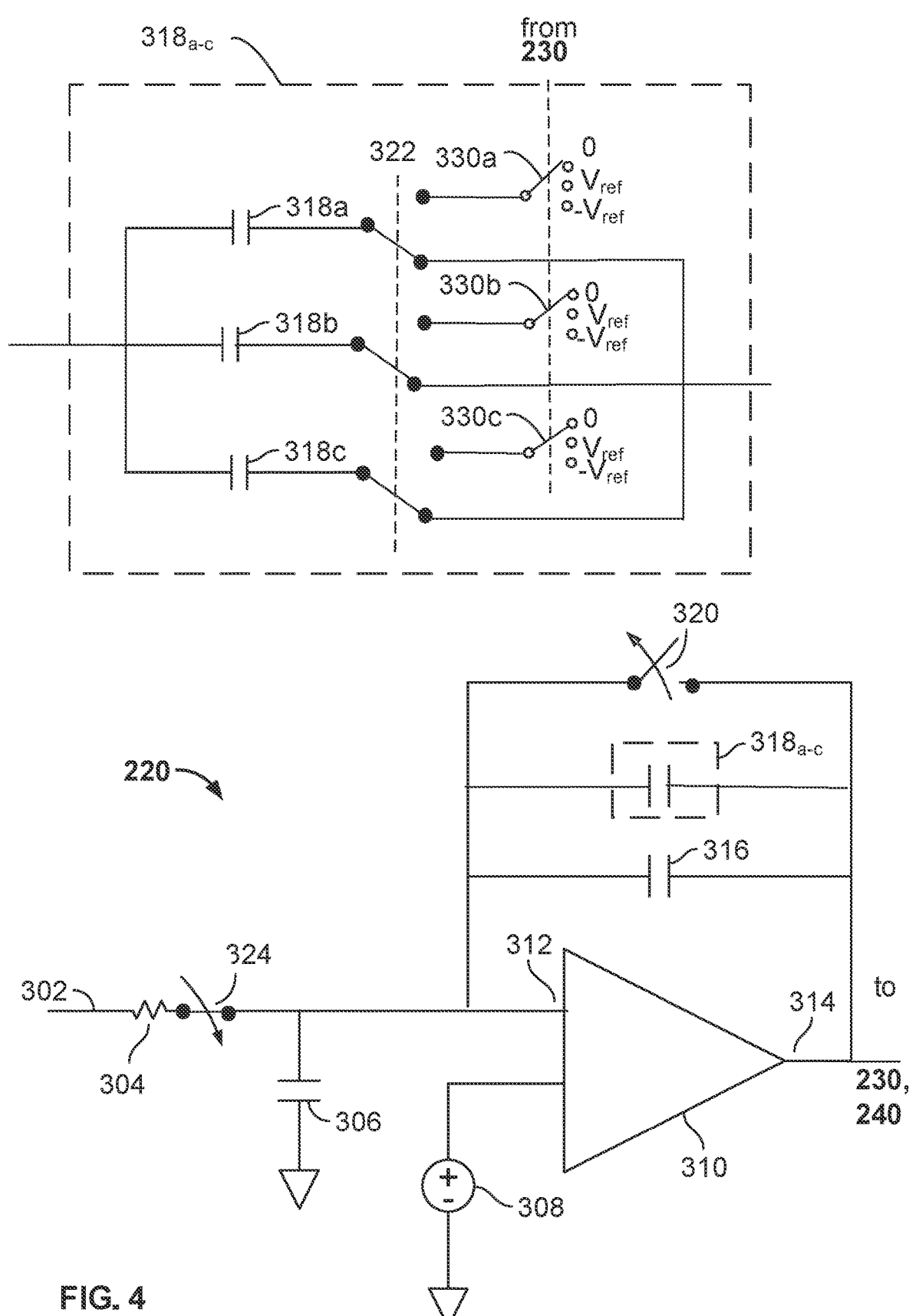
FIG. 4 depicts an exemplary high precision integrator in an initial integration mode in accordance with an embodiment of the present disclosure.

FIG. 4 depicts an exemplary high precision integrator 220 in an initial integration mode in accordance with an embodiment of the present disclosure. FIG. 4 includes the same components as FIG. 3, and components may be added, removed, and modified as described with respect to FIG. 3. As is depicted in FIG. 4, the states of reset switch 320 and input switch 324 have changed such that reset switch 320 is open and input switch 324 is closed. Opening reset switch 320 removes the short between amplifier input node 312 and amplifier output node 314, effectively placing capacitor 316 and reference capacitor bank 318a-c in parallel with amplifier 310.

The capacitors of reference capacitor bank 318a-c may have a predetermined relationship with capacitor 316 and/or capacitors of capacitor bank 318a-c, for example, to provide appropriate scaling between the initial measurement performed by the high precision integrator in accordance with the respective characteristics of the feedback capacitor 316 and the capacitors of the reference bank 318a-c (e.g., number of capacitors, capacitance of capacitors, signal source voltages potentially applied to the capacitors, etc.). In an exemplary embodiment of a "2.5 Bit" resolution high-precision integrator, the capacitance of the capacitors 318a, 318b, and 318c may be the same (or similar, within acceptable tolerances) as the capacitance of feedback capacitor 316. Reference capacitor bank 318a-c provides the "coarse" scaling associated with the potential selection (e.g., via application of source signals) of capacitors 318a, 318b, and/or 318c, and accordingly, may have a capacitance of approximately three times the capacitance of feedback capacitor 316. The respective values of the feedback capacitor(s), reference capacitor(s), capacitors of the capacitor bank, and any reference signals and additional switching may be modified in a number of manners, such as to scale to different input signal types, required resolution, or other configurations. In this manner, you can increase "coarse" resolution by adding more "n" to capacitors and more comparators. For example, a coarse resolution of 2.5-bits requires four capacitors 318a-318c and 316, equal to 4C. For a 3.5-bit coarse resolution you need 8C, and so on for higher resolutions. The number of comparators also increases from 6 to 14 with reference $\frac{1}{16}$th Vref, $\frac{3}{16}$th and so on to $\frac{13}{16}$th. In this manner, the number of comparators increases by 2 to the power of the coarse resolution minus 2.

In the configuration of FIG. 4, an input sense signal 302 (e.g., a signal representing a sensed capacitance) is provided to the high precision integrator 302 and integrated via the circuit including an RC input (e.g., via resistor 304 and parasitic capacitor 306) to input node 312 of amplifier 310, with a feedback path between output node 314 of amplifier 310 including feedback capacitor 316 in parallel with reference capacitors 318a-c, and accordingly, modified and scaled in accordance with the combined capacitance of the parallel capacitors. Accordingly, an output signal corresponding to the initial output is provided at output node 314 that is amplified to cover more of the dynamic range of amplifier 310 as well as associated components (e.g., of evaluation circuitry 230) for more precision in analyzing coarse and residue signals.

Figure 5:
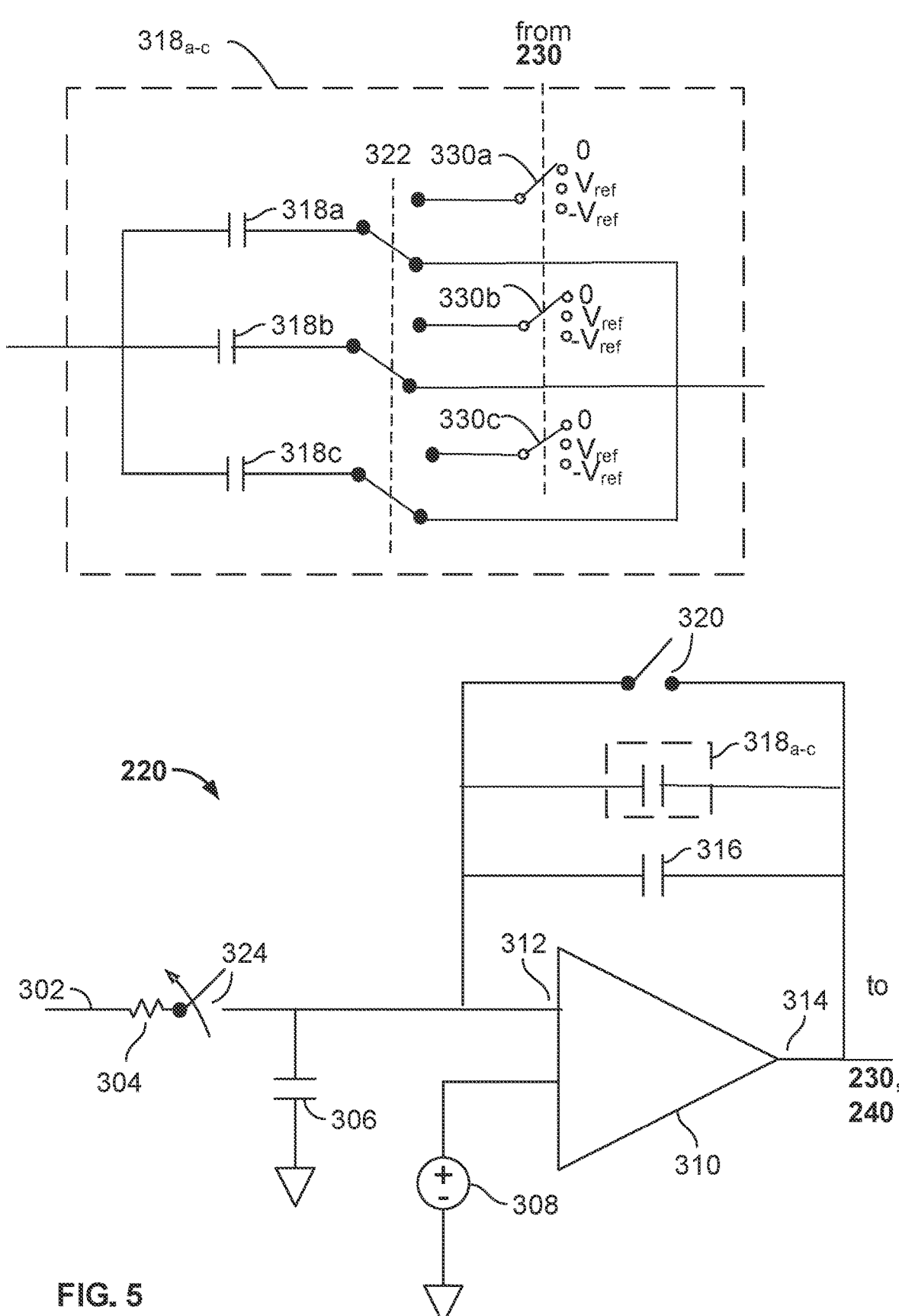
FIG. 5 depicts an exemplary high precision integrator in an initial evaluation mode in accordance with an embodiment of the present disclosure.

FIG. 5 depicts an exemplary high precision integrator 220 in an initial evaluation mode in accordance with an embodiment of the present disclosure. FIG. 5 includes the same components as FIG. 3, and components may be added, removed, and modified as described with respect to FIG. 3. As is depicted in FIG. 5, the state of input switch 324 is changed (e.g., opened) to remove the sense signal 302 from the signal path, as well, in some embodiments, as removing the resistor 304 from the high precision integrator 220. In this manner the integrator output is frozen at output node 314 in order to present the integrator output for coarse evaluation performed by circuit 230.

Figure 6A:
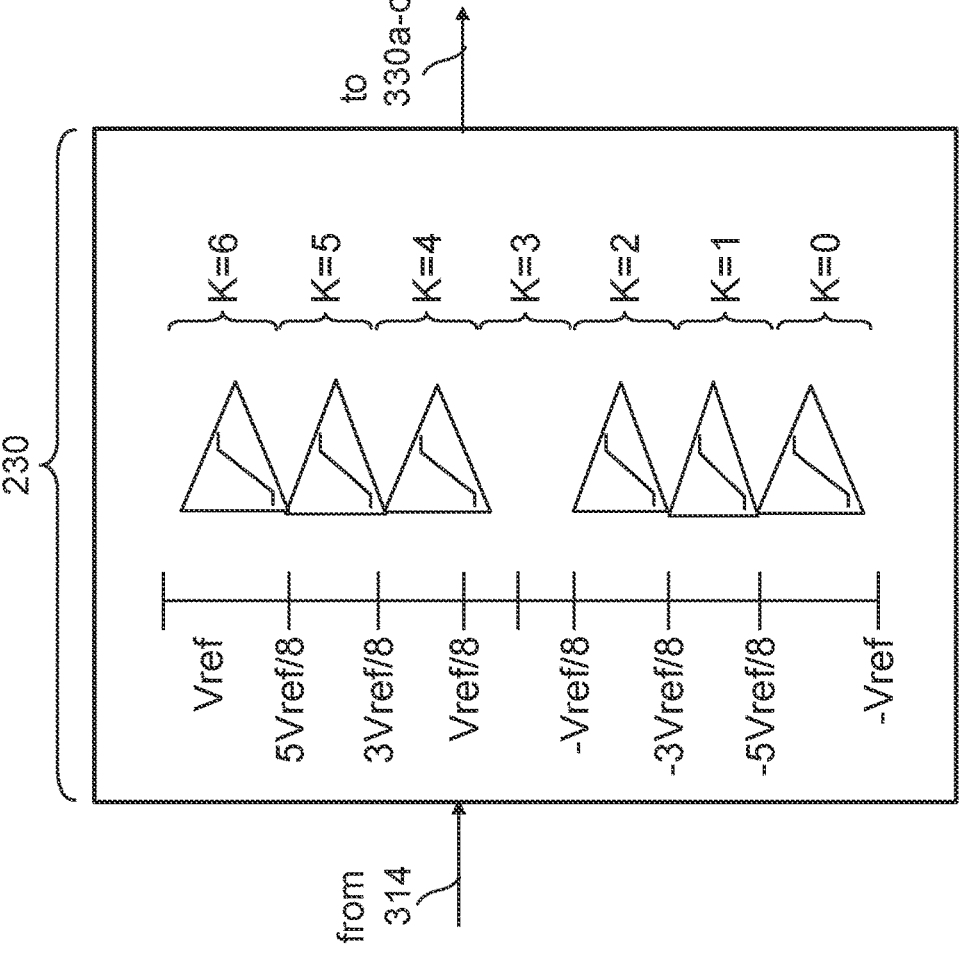
FIG. 6A depicts exemplary signal evaluation circuitry generating control signals for generating a residue output signal in accordance with an embodiment of the present disclosure.

FIG. 6A depicts exemplary signal evaluation circuitry 230 for generating control signals for a generating residue output signal in accordance with an embodiment of the present disclosure. In the exemplary embodiment as depicted in FIG. 6A, the signal evaluation circuitry 230 is implemented as a bank of comparators, although other forms of signal evaluation may be performed in other embodiments, such as an additional SAR ADC or one or more comparators performing serial comparisons. In the exemplary embodiment of FIG. 6A, a number of comparators is selected to provide an output resolution corresponding a number of bits associated with the respective options for providing control signals to the high precision integrator 220 (e.g., to a capacitor bank 318a-c of high precision integrator 220). The number of "bits" of signal evaluation circuitry 230 and their associated selection criteria may correspond to a particular design configuration of the high precision integrator 220, such as the number of capacitors in the capacitor bank, the capacitances in the capacitor bank (e.g., additional resolution may be provided by providing capacitors having a variety of potential values, as well as implementing switching to provide unique configurations), and the available signal sources (e.g., available voltages, signal patterns, etc.). In the exemplary embodiment of FIG. 6A, a "2.5 bit" pattern may facilitate seven potential output options for a coarse estimate and corresponding control signal output based on the received initial signal, each output option associated with a comparison of the signal being evaluated (or a portion of the signal associated with high-resolution information) to proportionally selected comparison values of a reference signal (e.g., at Vref, 0V, and −Vref).

Although the incoming signal is depicted in FIG. 6A as the signal output from output node 314 of amplifier 310, in embodiments the signal may undergo additional pre-processing (not depicted in FIG. 6A) before being provided to evaluation circuitry 230. For example, filters may remove known or likely undesired signal content or circuitry may modify or scale the signal amplitude, such as to provide a desired portion of the signal from output node 314 of amplifier 310 to the evaluation circuitry, such as a peak-to-peak signal portion associated with a high-precision resolution of system. In the embodiment of FIG. 6A, the initial signal generated at output node 314 during the initial evaluation mode is provided to the comparators of the evaluation circuitry (e.g., six comparators), with a particular reference signal (e.g., values between −Vref and +Vref based on the number of comparators) and a coarse estimate is performed to generate an output signal (e.g., a digital output signal corresponding to a value "k=0" through "k=6") that is provided as a control signal output to control components of the high precision integrator 220. For example, a particular output "k" value may correspond to particular configurations of components for the high precision stage of high precision integrator 220, such as by switching components in or out of circuits, connecting to particular source signals, and the like.

Figure 6B:
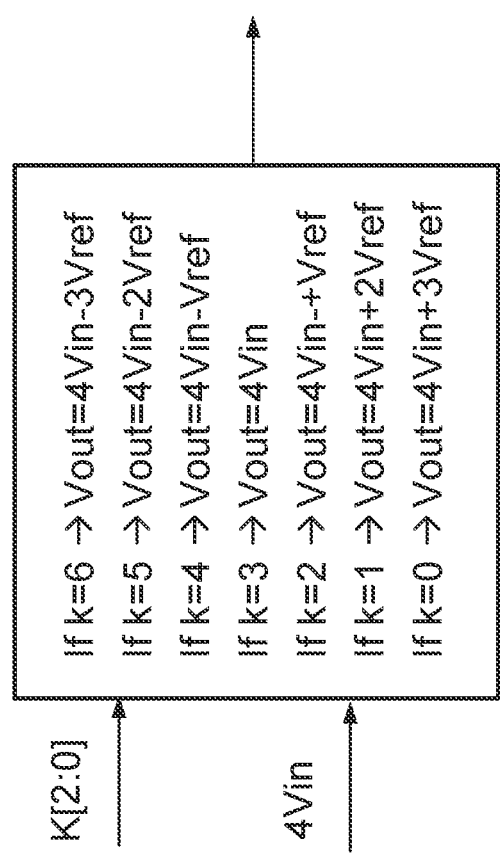
FIG. 6B depicts a functional diagram of generating a residue output in accordance with an embodiment of the present disclosure.

FIG. 6B depicts a functional diagram of generating a residue output in accordance with an embodiment of the present disclosure, corresponding to the particular configuration of components depicted and described in FIGS. 3-7. It will be understood that different configurations, such as different components, component values, number of "bits", source signals, input signals, and the like will have different associated functional diagrams. As described herein, the initial output signal from the integrator corresponding to the initial evaluation stage is generated based on connecting reference capacitor bank 318a-c, having a capacitance of three times the feedback capacitor 316, in parallel with feedback capacitor 316. The resulting signal, initially provided for evaluation, is also modified in accordance with the comparator outputs modifying the capacitor bank (e.g., 318a-c) based on the coarse estimate. The resulting residue output corresponds to the combination of the original output as modified by the reconfigured capacitors. For example, if the initial integrator estimate output is "A" and the coarse estimate results in control signals corresponding to "code-K," then capacitors 318 will be reconfigured based on K so as to force the integrator to produce the difference A–(K–3)*Vref/4, where this difference is the residue between the initial integrated signal "A" and a coarse estimate thereof K*Vref/4. The residue is then amplified by 4 and presented to SAR ADC. Vref is selected based on a desired predetermined relationship between the high-precision signal portion and the expected dynamic range of the input signal.

Figure 7:
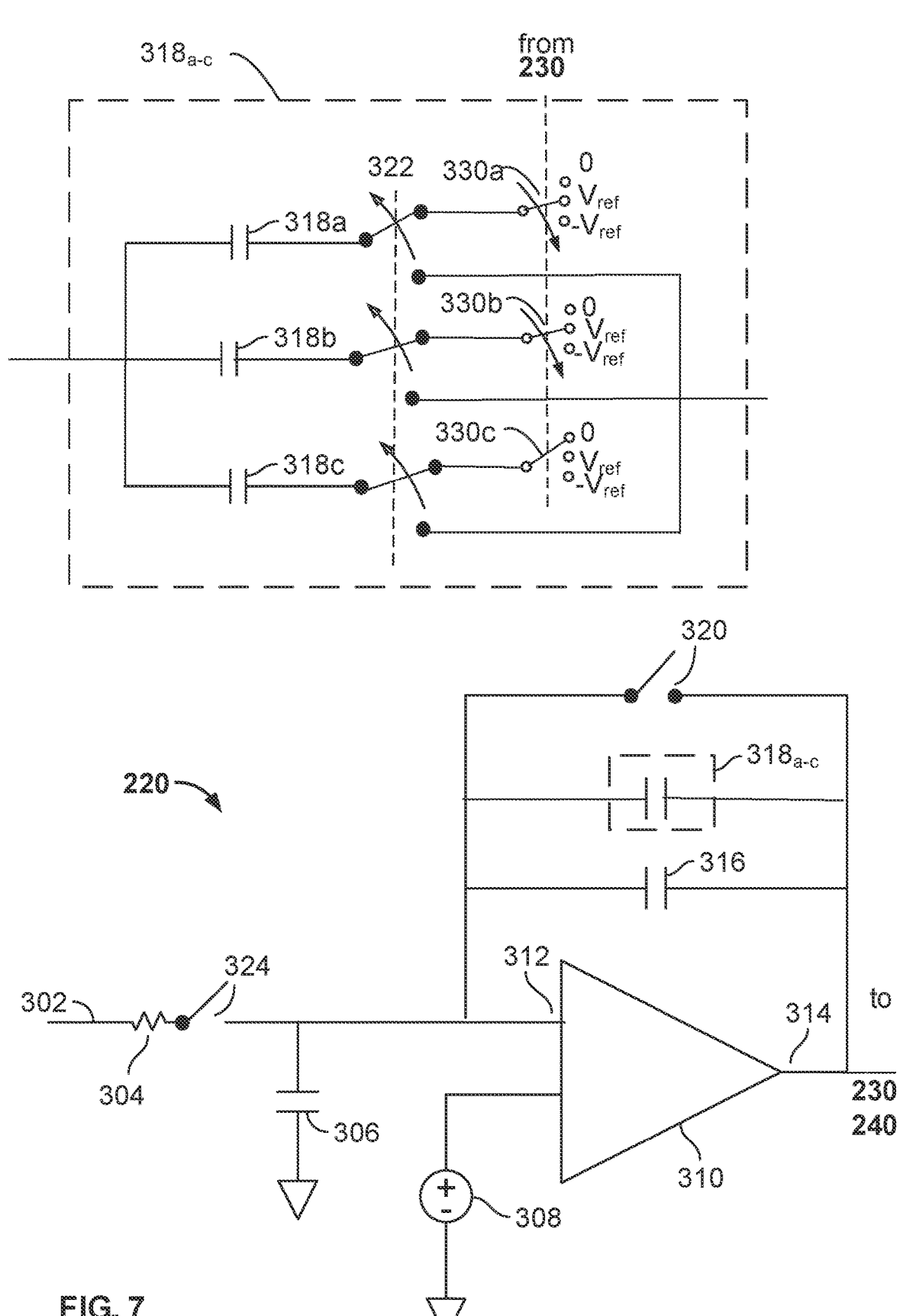
FIG. 7 depicts an exemplary high precision integrator applying capacitances in accordance with an output of the signal evaluation circuitry, in accordance with an embodiment of the present disclosure.

As depicted in more detail in FIG. 7, based on the control signal value (e.g., "k=0" to "k=6") selected based on the estimate of the evaluation circuit 230, a particular configuration of circuit components is implemented to provide the high precisions signal portion. For example, in the high precision stage of operation, each of three capacitors 318a, 318b, and 318c of the capacitor bank 318a-c is selectively connected to a respective signal source, for example, at potential values of ground (0V), Vref, and –Vref. By connecting from zero to all three of the capacitors 318a, 318b, and 318c (e.g., each having the same capacitance as feedback capacitor 316) to 0, Vref, or –Vref, a high-precision output associated with the capacitors 318a/318b/318c of capacitor bank 318a-c and feedback capacitor 316 generates an output signal ranging from 4Vin if all 3 capacitors are connected to ground (e.g., only the contribution of feedback capacitor 316, based on maintaining the voltage associated with the previous output during the evaluation stage) to 4Vin+3Vref if all three capacitors 318a/318b/318c are connected to –Vref, to 4Vin–3Vref if all three capacitors 318a/318b/318c are connected to +Vref, and multiple gradations between 4Vin+2Vref to 4Vin–2Vref.

In the embodiment depicted in FIG. 6B, a control signal value of K=6 corresponds to an overall high-precision output of 4Vin–3Vref (e.g., connecting all three of capacitors 318a/318b/318c to +Vref), a control signal value of K=3 corresponds to an overall high-precision output of 4Vin (e.g., connecting all three of capacitors 318a/318b/318c to ground), and a control signal value of K=0 corresponds to an overall high-precision output of 4Vin+3 Vref (e.g., connecting all three of capacitors 318a/318b/318c to –Vref), etc.

FIG. 7 depicts an exemplary high precision integrator 220 applying precision capacitances in accordance with an output of the signal evaluation circuitry, in accordance with an embodiment of the present disclosure. As will be understood, FIG. 7 is described in the context of a particular circuit configuration with particular components, and that other operations may be performed (e.g., connecting and/or disconnecting components, signals and signal paths) in accordance other designs implementing the high-precision integrator and associated components of the present disclosure.

As described herein, an integrator output is provided to the evaluation circuitry 230 from output node 314 of amplifier 310, during an evaluation mode (e.g., as depicted in FIG. 5) in which switch 320 is open (removing the short between input node 312 and output node 314), switch 322 is closed (connecting reference capacitor bank 318a-c, having a capacitance of three times the capacitance of feedback capacitor 316, in parallel with feedback capacitor 316), and switch 324 is recently opened (removing the input signal 302 and resistor 304 from the circuit of the high precision integrator 220).

In the residue generation phase depicted in FIG. 7, switch 322 is opened, removing capacitor bank 318a-c from the circuit path between input node 312 and output node 314, and from a parallel configuration with respect to reference capacitor 316.

Control signals from evaluation circuitry 230 are provided to capacitor bank 318a-c, which in the embodiment of FIG. 7, corresponds to a control signal of "k=5" in which two of the three capacitors (e.g., capacitors 318a and 318b) are connected to +Vref via corresponding switches 330a and 330b, effectively generating an amplified residue signal in accordance with the selection of the control signal. With two capacitors 318a and 318b, having the same capacitance as reference capacitor 316, connected on one side to Vref and on the other side to input node 312 of amplifier 310, an amplifier output will correspond to the residue output signal equivalent to 4Vin–2Vref. As another example, not depicted in FIG. 7, a control signal of "k=6" would connect each of capacitors 318a, 318b, and 318c to +Vref (e.g., via corresponding switches 330a, 330b, and 330c), resulting in a high precision output of 4Vin–3Vref.

Figure 8:
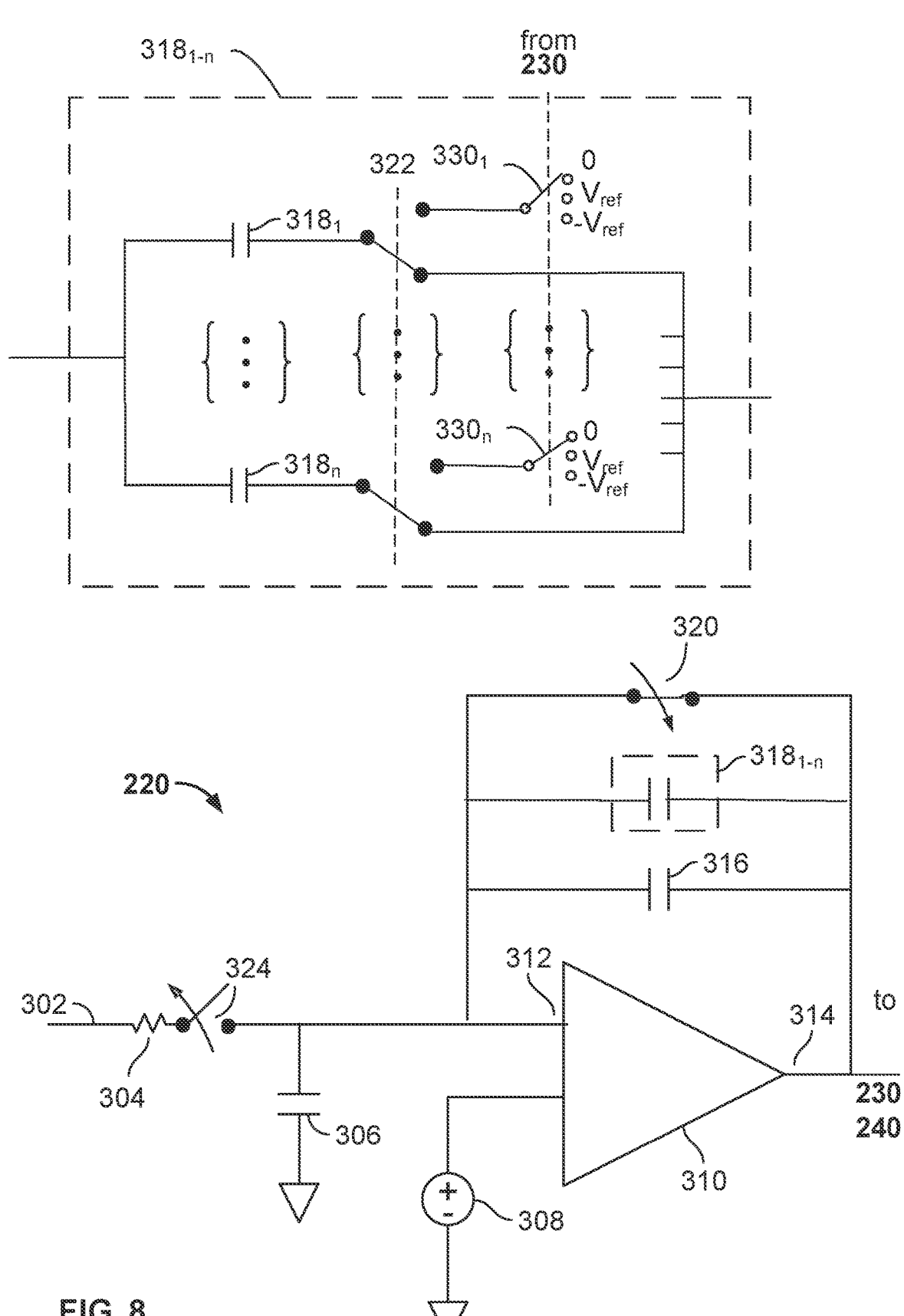
FIG. 8 depicts an exemplary high precision integrator applying n-bit capacitances in accordance with an output of the signal evaluation circuitry, in accordance with an embodiment of the present disclosure.

This resulting amplified residue signal output signal is provided from output node 314 of amplifier 310 to additional circuitry, such as a SAR ADC 240, for digitizing and final resolution of the digital signal. SAR ADC digitizes the received residue signal (e.g., after application of capacitors 318a/318b/318c in the residue generating stage, described in FIG. 7), which is then combined digitally with coarse code output "K" (FIG. 6B) of the comparator array (FIG. 6A). For a 15-bit ADC, as an example, the Total Digital output code is equal to (K–3)*4096+SAR output, if SAR resolution is 13-bits including sign bit. The overall ADC resolution can be further increased by using more comparators and more units of capacitors 318 as shown in FIG. 8. In another embodiment a 3.5-bit coarse architecture would result in a 16-bit Nyquist ADC, when combined with a 13-bit (sign bit included) SAR ADC. The Total Digital Output code for that design would be (K–7)*4096+SAR output, with K ranging from 0 to 14.

A resettable reconfigurable high precision integrator as described herein may be utilized as the first stage of the high resolution of a Nyquist ADC. This configuration enables noise filtering due to the integrator's anti-aliasing properties. The amplification of the integrator output and/or residue are amplified, suppressing input-referred SAR noise at the SAR ADC. Providing the signal to the SAR ADC in this manner reduces noise and allows for lower noise at similar power consumption levels compared to other continuous time ADC implementations, such as Sigma-Delta ADCs. Since this is a Nyquist ADC, it has low quantization noise and does not require any additional filtering of its output. This reduces latency and enables round robin (e.g., multiplexed) applications, where multiple axes are sensed by the same C2V amplifier and ADC, resulting in a large reduction of area compared to duplicating circuitry for each sense axis or sensor.

A resettable and reconfigurable high precision integrator as described herein has a sinc transfer function and notches out tones at frequencies equal to integration frequency, which can be selected (e.g., by component selection) in accordance with desired and/or resonant frequencies. For example, in an exemplary MEMS gyroscope application, the integration frequency may be equal to the drive/sense frequency of the gyroscope, resulting in the elimination of drive-related harmonics.

FIG. 8 depicts an exemplary high precision integrator applying n-bit precision capacitances in accordance with an output of the signal evaluation circuitry, in accordance with an embodiment of the present disclosure. As described herein, the high precision integrator of the present disclosure may be implemented in a variety of configurations, including having additional "bits" of precision. As depicted in FIG. 8, "n" capacitors $318_1$-$318_n$ are included within capacitor bank $318_{1-n}$, with each capacitor of $318_1$-$318_n$ associated with a corresponding switch $330_1$-$330_n$ to be selectively connected to source voltages (e.g., 0V, Vref, and −Vref). In this manner, additional "bits" of precision may be added to the high-precision stage, with a corresponding increase in the number of comparators in the evaluation circuitry 230. Moreover, the value of reference capacitor may be adjusted, for example, to match the total combined capacitance in the capacitor bank. For example, if n=7 for a total of seven capacitors in capacitor bank $318_{1-n}$, and each capacitor has a capacitance value of $C_{int}$ corresponding to the capacitance of feedback capacitor 316, reference capacitor bank $318_{1-7}$ (i.e., with n=7) may have a capacitance of $7*C_{int}$. Thus, a corresponding output range of the high-precision stage of such a configuration would correspond to 8*Vin plus or minus 7*Vref, with available steps at 6*Vref, 5*Vref, etc. In this manner, a "3.5 bit" residue output resolution with 15 potential output levels may be implemented.

Figure 9:
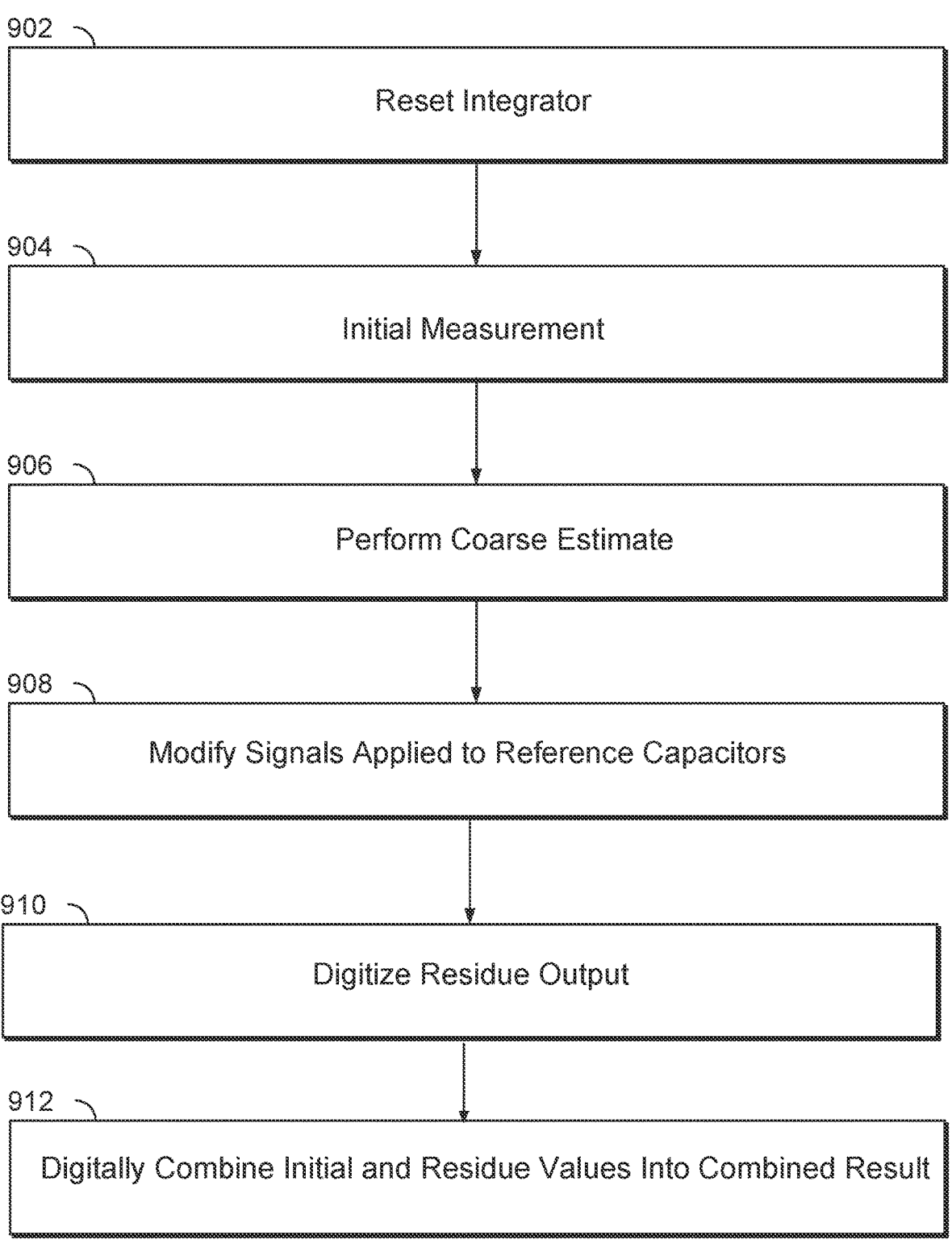
FIG. 9 depicts exemplary steps of operating a continuous time pipeline analog-to-digital converter in accordance with an embodiment of the present disclosure.

FIG. 9 depicts exemplary steps of operating a continuous time pipeline analog-to-digital converter in accordance with an embodiment of the present disclosure. Although particular steps are depicted in a certain order for FIG. 9, steps may be removed, modified, or substituted, and additional steps may be added in certain embodiments, and in some embodiments, the order of certain steps may be modified.

Processing starts at step 902, where the high-precision integrator is reset to receive a new input signal. In an embodiment of a single sensor or sensor axis, the reset may simply be performed to begin the steps of the quantization process. In embodiments of a multi-axis sensor or multi-sensor application, the input signal being provided may be from an entirely different source, such as a different sense axis of a MEMS gyroscope. Although the high-precision integrator may be reset in a variety of manners, in an embodiment, the feedback path of the amplifier of the integrator (e.g., a C2V amplifier) may be shorted between the amplifier input node and output node, such as by a switch closing a path between the input and output. In some embodiments, the high precision integrator may also be disconnected from the input signal path during the reset, such as by opening a switch connected to the input signal path. Once the high-precision integrator has been reset, processing may continue to step 904.

At step 904, an initial measurement may be performed based on the high-precision integrator configuration. The reset process may be completed such as by removing the short between the input node and output node of the amplifier (e.g., opening the switch in parallel with the C2V amplifier and a reference capacitor and feedback capacitor), thus connecting a reference capacitor in parallel with the amplifier between the amplifier input node and output node. The reference capacitor may be a capacitor bank that is connected in parallel to the feedback capacitor between the input node and output node, and in embodiment, may have a capacitance that is an integer multiple of the capacitance of the feedback capacitor, with the integer value corresponding to a number capacitors located in the capacitor bank utilized during a residue amplification stage of integrator operation. The integrator input node may also be connected to the input signal (e.g., via an input RC circuit) such as by closing a switch in the input circuit path. In embodiments where multiple sensors and/or axes are connected to a common high precision integrator, this may be coordinated with providing a particular signal of interest to the input circuit. Once the input signal has been received, the input signal may be removed from the input circuit path (e.g., by opening a switch within the circuit path) and the resistor of the integrator may also be removed from the integrator circuit (e.g., by being located on the input side of the open switch), providing a stable signal for output and analysis. The resulting output corresponds to an initial output value, which is provided to the evaluation circuit (e.g., a bank of comparators) for further analysis such as performing a coarse estimate. Processing may then continue to step 906.

At step 906, the initial output signal is analyzed by the evaluation circuit by performing a coarse estimate, to determine a control signal to be provided back to the high precision integrator to set the residue signal value. In an embodiment, the received signal at the evaluation circuit is compared to each of a plurality of comparators, with a number of comparators corresponding to a number of "bits" available for generating the residue, and thus, a resolution of the residue output. The comparison results in a control signal that is provided back to the high precision integrator, for example, to a bank of capacitors of the high precision integrator. Processing may then continue to step 908.

At step 908, the operation of the capacitors associated with the residue signal may be modified, such as by applying differing voltages to capacitor nodes, wherein the opposite nodes are connected to the amplifier input node. For example, in accordance with the control signal generated by the evaluation circuit, multiple capacitors of the capacitor bank may be connected to particular voltages, providing essentially multiple steps or "bits" of potentially connected capacitors. The resulting residue output signal may be scaled in accordance with the respective component capacitances and applied signals, for example, in a 3-capacitor capacitor bank, with a signal have a base value of 4*Vin (e.g., associated with the capacitances of the reference capacitor and capacitor bank and an input Vin) and plus or minus up to 3*Vref (associated with the capacitances of the capacitors of the capacitor bank and a signal source having a value of Vref). Once the residue output signal is output by the integrator, processing may continue to step 910.

At step 910, the residue signal is provided to the SAR ADC to be digitized. Processing then continues to step 912, at which time the respective digitized initial and residue output signals (e.g., from steps 904 and 910) are digitally combined with processing circuitry. In an example, a "K" coarse bit value shown in FIG. 6B can be combined with 12-bit (plus sign) output of the SAR ADC based on the following equation—(K−3)*4096+SAR Output.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A method for processing a sensed signal for analog-to-digital conversion (ADC), comprising:

resetting an integrator circuit such that a previous output value from the integrator circuit is no longer present at an output of the integrator circuit, wherein the integrator circuit comprises an amplifier, a resistor located between an input node of the amplifier and the input to the integrator circuit, and at least one capacitor coupled between the input node of the amplifier and an output node of the amplifier;

receiving, at an input to the integrator circuit, the sensed signal;

integrating, by the integrator circuit, the sensed signal, wherein, based on the value of the resistor, the value of the at least one capacitor, and the resetting of the integrator a transfer function of the integrator comprises a sinc transfer function that performs built-in anti-aliasing filtering at the integrator input;

evaluating an output of the integrator circuit due to the integrating to generate a single estimate of the integrated signal;

modifying the output of the integrator circuit by removing a signal portion corresponding to the single estimate from the output of the integrator circuit to create a residual signal portion; and determining a digital value for the sensed signal based on the modified output.

2. The method of claim 1, wherein resetting the integrator circuit comprises shorting an electrical connection between the input node and the output node.

3. The method of claim 2, wherein, prior to integrating the sensed signal, the method further comprises opening the electrical connection between the input node and the output node.

4. The method of claim 2, further comprising, after the integrating and prior to the evaluating, opening a circuit between the resistor and the input node.

5. The method of claim 2, wherein the at least one capacitor comprises a first capacitor that is selectively in parallel with a second capacitor.

6. The method of claim 5, wherein the second capacitor has a second capacitance value that is approximately an integer multiple of a first capacitance value of the first capacitor.

7. The method of claim 5, wherein during the evaluating, both the first capacitor and the second capacitor are electrically connected between the input node and the output node.

8. The method of claim 7, wherein during the modifying, the first capacitor is electrically connected between the input node and the output node while the second capacitor is not electrically connected between the input node and the output node.

9. The method of claim 8, wherein the second capacitor comprises a plurality of parallel capacitors, and wherein the modifying further comprises:

determining, based on the estimate, a respective voltage value to provide from a respective voltage source of a plurality of voltage sources to a respective capacitor of the plurality of capacitors, wherein each capacitor of the plurality of capacitors is selectively connected between one of the voltage sources of the plurality of voltage sources and the input node; and applying the respective voltage values to respective voltage sources.

10. The method of claim 9, wherein a capacitance of each capacitor of the plurality of capacitors is the same as the first capacitor.

11. The method of claim 1, wherein evaluating the output of the integrator circuit comprises providing the output of the integrator circuit to a bitwise comparator to generate a multi-bit digital value representative of the output of the integrator circuit.

12. The method of claim 11, wherein modifying the output of the integrator circuit based on the estimate comprises providing an additional input signal to the input based on the multi-bit digital value.

13. The method of claim 1, wherein determining the digital value for the sensed signal based on the modified output comprises digitally combining an initial signal portion associated with the output of the integrator circuit and the residue signal portion based on the modified output.

14. The method of claim 13, wherein a successive-approximation-register analog-to-digital converter outputs a digital version of the initial signal portion and a digital version of the residue signal portion, and wherein processing circuitry combines the digital version of the initial signal portion and the digital version of the residue signal portion to determine the digital value.

15. The method of claim 1, wherein the sensed signal is based on an output of an analog device.

16. The method of claim 15, wherein the analog device comprises a gyroscope, an accelerometer, pressure sensor, temperature sensor, gas sensor, microphone, fingerprint sensor, ultrasonic range finder, or ultrasonic cardiovascular sensor.

17. A method for processing a sensed signal from one of a plurality of inertial sensors, comprising:

resetting an integrator circuit such that a previous output value from the integrator circuit is no longer present at an output of the integrator circuit, wherein the integrator circuit comprises an amplifier, a resistor located between an input node of the amplifier and an input to the integrator circuit, and at least one capacitor coupled between the input node of the amplifier and an output node of the amplifier;

switching an input node of the integrator circuit into electrical connection with the one of the plurality of inertial sensors;

receiving, at the input node of the integrator circuit, the sensed signal;

integrating, by the integrator circuit, the sensed signal, wherein, based on the value of the resistor, the value of the at least one capacitor, and the resetting of the integrator a transfer function of the integrator comprises a sinc transfer function that performs built-in anti-aliasing filtering at the integrator input;

evaluating an output of the integrator circuit due to the integrating to generate a single estimate of the integrated signal;

generating, based on the evaluating, a residual estimate associated with the sensed signal by removing the single estimate of the integrated signal from the output of the integrator circuit;

modifying a source signal provided to one or more capacitors connected to the integrator circuit based on the residual estimate; and outputting a modified signal based on the modifying.

18. A system for processing a sensed signal for analog-to-digital conversion, comprising:

an integrator circuit that receives and integrates the sensed signal, wherein the integrator circuit comprises:

an amplifier;

a resistor located between an input node of the amplifier and an input to the integrator circuit;

a plurality of capacitors coupled between the input node of the amplifier and an output node of the amplifier; and reset circuitry configured to reset the integrator circuit such that a previous output value from the integrator circuit is no longer present at an output of the integrator circuit, wherein, based on the value of the resistor, the values of the plurality of capacitors, and the resetting of the integrator circuit a transfer function of the integrator comprises a sinc transfer function that performs built-in anti-aliasing filtering at the integrator input;

a comparison circuit coupled to an output of the integrator circuit, wherein the comparison circuit receives the integrated sensed signal from the output of the integrator circuit and generates a single estimate of the integrated sensed signal, and generates one or more control signals based on the single estimate of the integrated sensed signal; and a plurality of signal sources each associated with one or more of the plurality of capacitors, wherein a respective connection between respective signal sources of the plurality of signal sources and respective capacitors of the plurality of capacitors is modified based on the one or more control signals to remove the estimate of the integrated sensed signal from the integrator circuit.

\* \* \* \* \*